(12) United States Patent
Mizumura

(10) Patent No.: US 10,173,240 B2
(45) Date of Patent: Jan. 8, 2019

(54) MASK AND METHOD FOR MANUFACTURING THE SAME

(71) Applicant: V TECHNOLOGY CO., LTD., Kanagawa (JP)

(72) Inventor: Michinobu Mizumura, Kanagawa (JP)

(73) Assignee: V TECHNOLOGY CO., LTD. (JP)

( * ) Notice: Subject to any disclaimer, the term of this patent is extended or adjusted under 35 U.S.C. 154(b) by 14 days.

(21) Appl. No.: 15/175,365

(22) Filed: Jun. 7, 2016

(65) Prior Publication Data

US 2016/0288163 A1    Oct. 6, 2016

Related U.S. Application Data

(63) Continuation of application No. PCT/JP2014/082756, filed on Dec. 10, 2014.

(30) Foreign Application Priority Data

Dec. 13, 2013 (JP) .................................. 2013-258324

(51) Int. Cl.
  *B05C 21/00* (2006.01)
  *C23C 14/04* (2006.01)

(52) U.S. Cl.
  CPC ............ *B05C 21/005* (2013.01); *C23C 14/04* (2013.01); *C23C 14/042* (2013.01)

(58) Field of Classification Search
  None
  See application file for complete search history.

(56) References Cited

U.S. PATENT DOCUMENTS

| 2004/0003775 | A1 | 1/2004 | Kim |
| 2005/0109273 | A1 | 5/2005 | Kim |
| 2011/0139069 | A1* | 6/2011 | Ahn ...................... C23C 14/042 |
| | | | 118/504 |
| 2014/0150721 | A1* | 6/2014 | Oh ........................ C23C 14/042 |
| | | | 118/504 |

(Continued)

FOREIGN PATENT DOCUMENTS

| CN | 1476041 A | 2/2004 |
| JP | 10330911 | 12/1998 |
| JP | 2004036001 A | 2/2004 |

(Continued)

OTHER PUBLICATIONS

International Search Report for Application No. PCT/JP2014/082756 dated Mar. 10, 2015.

(Continued)

*Primary Examiner* — Jethro M. Pence
(74) *Attorney, Agent, or Firm* — Lerner, David, Littenberg, Krumholz & Mentlik, LLP

(57) ABSTRACT

The present invention provides a mask having a plurality of elongate openings formed in a substrate, including: a plurality of reinforcement portions having a thickness smaller than a thickness of the substrate and bridging the openings across a longitudinal direction thereof on one side of the substrate; and a recess portion having a step formed by excavating an area around the openings on each side of the reinforcement portions along the longitudinal direction. The mask accordingly achieves and retains high mechanical strength without increasing the mask thickness.

2 Claims, 6 Drawing Sheets

(56) References Cited

U.S. PATENT DOCUMENTS

2014/0199808 A1 7/2014 Sugimoto et al.
2015/0037928 A1* 2/2015 Hirobe .................. C23C 14/042
　　　　　　　　　　　　　　　　　　　　　　438/99

FOREIGN PATENT DOCUMENTS

| JP | 2005142172 A | 6/2005 |
| JP | 2013095992 A | 5/2013 |
| JP | 2013163864 A | 8/2013 |

OTHER PUBLICATIONS

Japanese Office Action for Application No. JP2013258324 dated Aug. 22, 2017.
Chinese Office Action in Application No. 201480067341.9 dated Apr. 16, 2018.

* cited by examiner

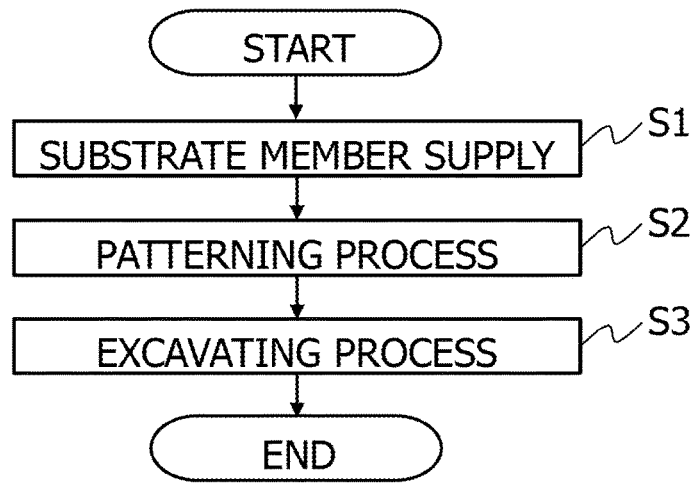
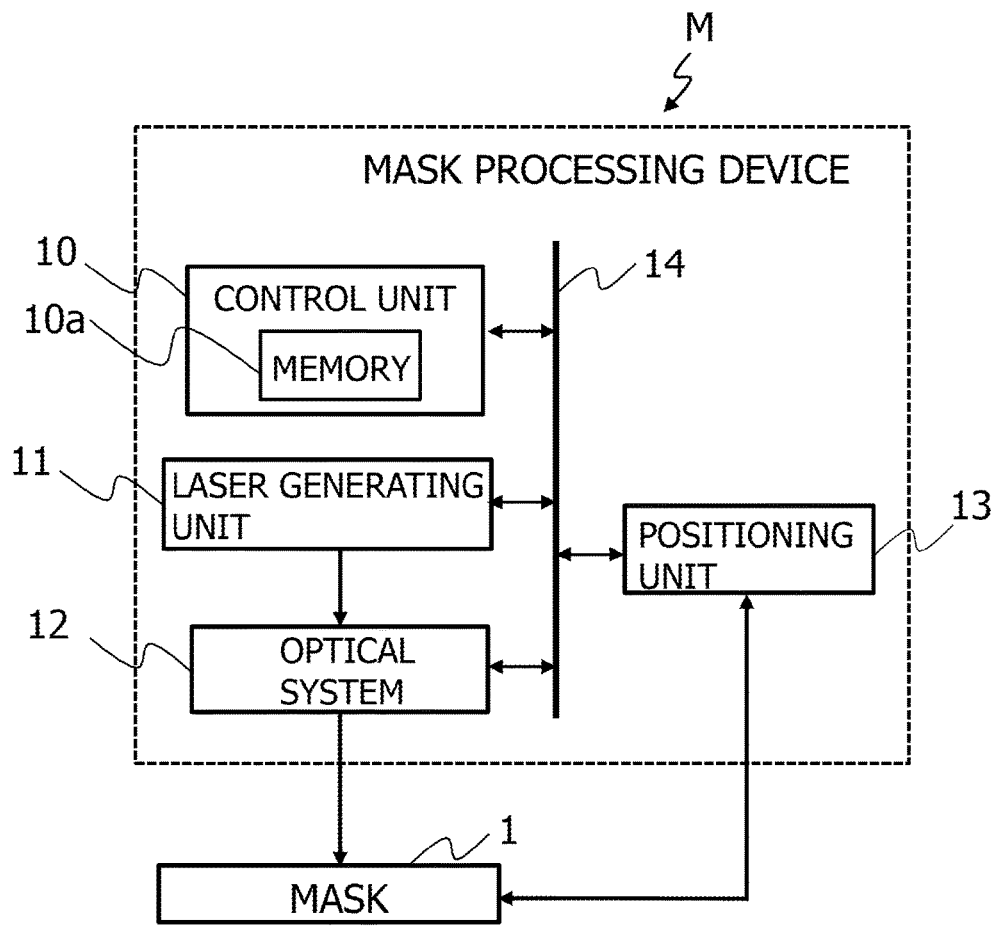

MASK AND METHOD FOR MANUFACTURING THE SAME

CROSS-REFERENCE TO RELATED APPLICATION

The present application is a continuation of International Application No. PCT/JP2014/082756 filed Dec. 10, 2014, which claims priority from Japanese Patent Application No. 2013-258324 filed Dec. 13, 2013, the disclosures of which are hereby incorporated herein by reference.

BACKGROUND OF THE INVENTION

1. Field of the Invention

The present invention relates to a mask having plural elongate openings formed in a substrate and a method for manufacturing the mask, and more particularly to a mask that achieves and retains high mechanical strength without increasing its thickness by applying special processing to an area around each opening, and a method for manufacturing the mask.

2. Description of Related Art

Conventional masks, for example, have plural elongate openings formed in a substrate, for example. In order to avoid the deformation which occurs as the openings become finer, proposed is a mask integrated with reinforcement wires extending across the openings (see, for example, JP H10-330911 A).

SUMMARY OF THE INVENTION

However, such a conventional mask, for example, has wasteful space in the mask height direction so that an incoming substance from a specific direction can reach an area below the reinforcement wire without being blocked by the wire upon actual patterning for deposition etc. This causes a problem of increasing the total thickness of the conventional mask.

Thus, in order to overcome the above problem, it is an object of the present invention to provide a mask that achieves and retains high mechanical strength without increasing its thickness by applying special processing to an area around an opening, and a method for manufacturing the mask.

In order to achieve the above object, the present invention provides a mask having a plurality of elongate openings formed in a substrate, including: a plurality of reinforcement portions having a thickness smaller than a thickness of the substrate and bridging the openings across a longitudinal direction thereof on one side of the substrate; and a recess portion having a step formed by excavating an area around the openings on each side of the reinforcement portions along the longitudinal direction.

Furthermore, in order to achieve the above object, the present invention also provides a method for manufacturing a mask having a plurality of elongate openings formed in a substrate, including: a first step of processing a first surface of the substrate to form a plurality of grooves in areas to be the openings; and a second step of processing a second surface opposite to the first surface to penetrate the grooves and thereby form the openings while forming a plurality of reinforcement portions that have a thickness smaller than a thickness of the substrate and bridge the openings across a longitudinal direction thereof and also excavating an area around the openings on each side of the reinforcement portions to form a recess portion having a step along the longitudinal direction.

Since the mask according to the present invention includes a plurality of reinforcement portions having a thickness smaller than a thickness of the substrate and bridging the openings across a longitudinal direction thereof on one side of the substrate, and a recess portion having a step formed by excavating areas around the openings on each side of the reinforcement portions along the longitudinal direction, the mask thickness does not have to increase for forming the reinforcement portions and the reinforcement portions can retain the mask strength. Accordingly, even though plural elongate openings are formed, the mask can avoid the deformation of the openings.

Further, since the method for manufacturing a mask according to the present invention includes a first step of processing a first surface of the substrate to form a plurality of grooves in areas to be the openings, and a second step of processing a second surface opposite to the first surface to penetrate the grooves and thereby form the openings while forming a plurality of reinforcement portions that have a thickness smaller than a thickness of the substrate and bridge the openings across a longitudinal direction thereof and also forming a recess portion having a step by excavating areas around the openings on each side of the reinforcement portions along the longitudinal direction, it is possible to manufacture a mask that achieves and retains high mechanical strength without increasing the mask thickness. Therefore, according to the above method for manufacturing a mask, even though the mask has plural elongate openings, it is possible to avoid the deformation of the openings.

BRIEF DESCRIPTION OF THE DRAWINGS

FIG. 7 is a flowchart showing an example of a method for manufacturing a mask according to the present invention.

FIG. 8 is a block diagram showing a configuration example of a mask processing device.

DESCRIPTION OF PREFERRED EMBODIMENTS

Hereinafter, an embodiment of the present invention is described with reference to the accompanying drawings.

Figure 1A:
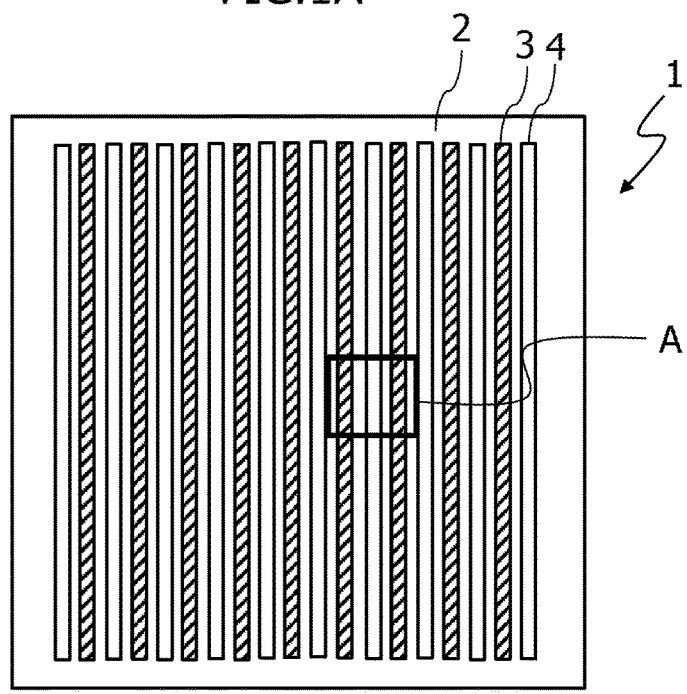
FIG. 1A is a plan view showing a mask according to an embodiment of the present invention.
Figure 1B:
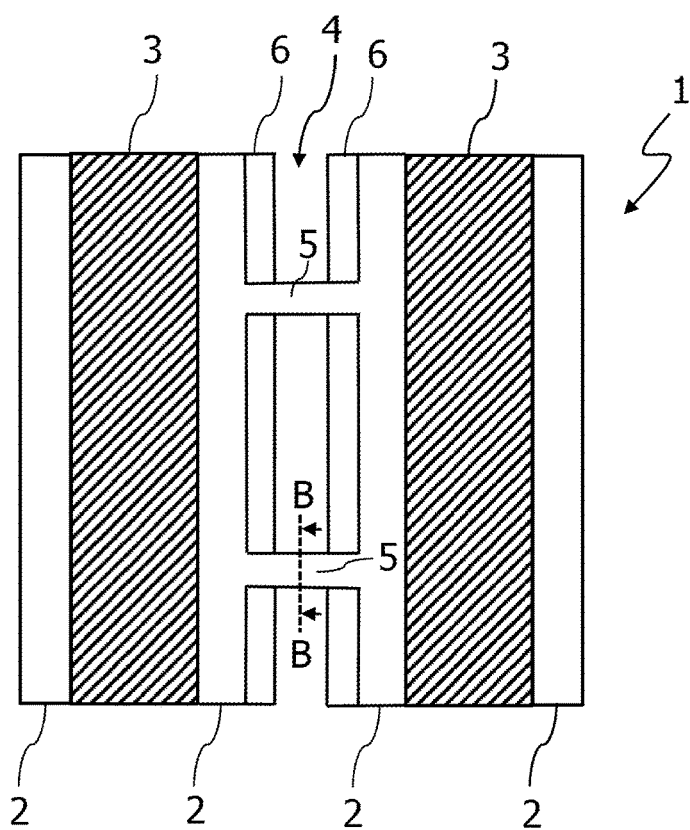
FIG. 1B is a partially enlarged plan view thereof.

FIG. 1A is a plan view showing a mask according to the embodiment of the present invention, and FIG. 1B is a partially enlarged plan view thereof.

A mask 1 shown in FIG. 1A has plural elongate openings but does not suffer from deformation even though the openings are becoming finer. The mask is provided with a substrate 2, metal portions 3, and openings 4. Both sides of the mask 1 are processed. FIG. 1A shows the shape of the front side (second surface). The substrate 2 is a polyimide resin film. The linear magnetic metal portions 3 are alternating with the openings 4 at predetermined intervals on the resin film. Thus, the substrate 2 constitutes a hybrid mask having the metal portions 3 formed on the resin film.

Here, the linear metal portions 3 are, for example, used to magnetically hold the mask 1 itself at the time of deposition. The metal portions 3 can be, for example, nickel as a magnetic material. The metal portions 3 have only to be provided on the front side (second surface) in view of magnetically holding the mask 1. The mask thickness is preferably about 20 μm to 50 μm, for example.

Note that the metal portions 3 are not limited to nickel and may be a nickel alloy. The hybrid mask of this type can be magnetically held so that the substrate 2 can be laser-processed with precision. In addition, the width of each opening 4 is preferably about several μm, for example, from the viewpoint of fine processing.

FIG. 1B is an enlarged plan view of a portion surrounded by the frame A in FIG. 1A, which specifically shows an area around the opening. The mask 1 is further provided with plural reinforcement portions (ribs) 5 having the thickness smaller than the substrate 2 and bridging the opening 4 across the longitudinal direction thereof on the front side of the substrate 2, and with a recess portion 6 having a step formed by excavating areas around the openings on each side of the reinforcement portions 5.

Figure 2:
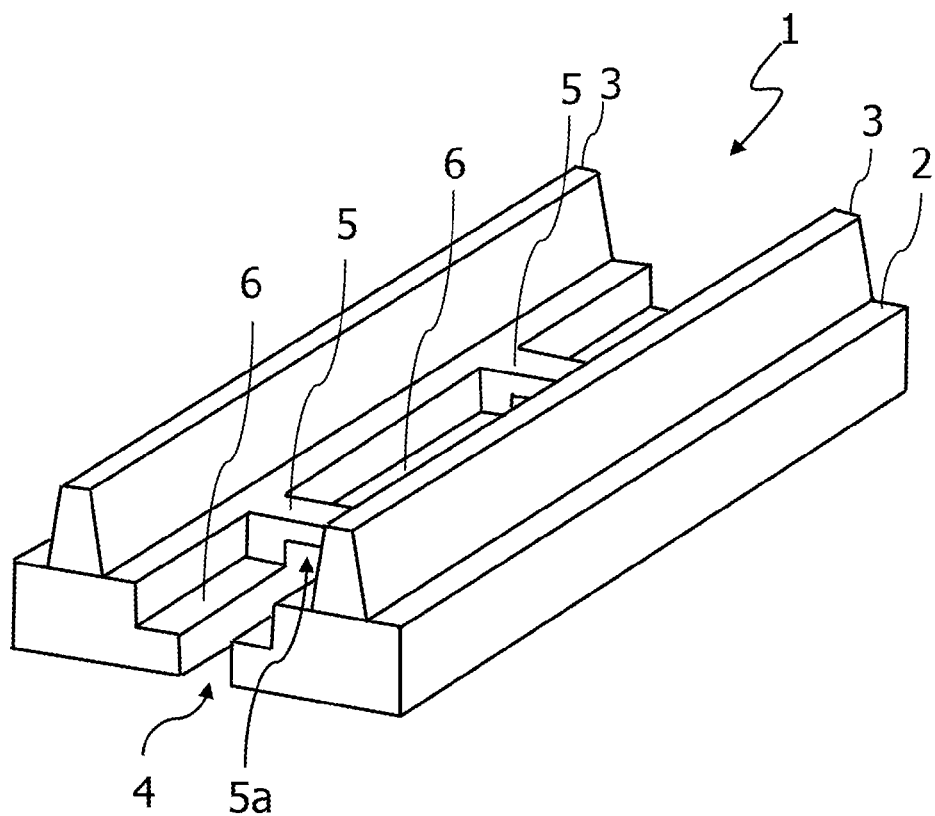
FIG. 2 is a perspective view of the mask shown in FIG. 1B.

FIG. 2 is a perspective view of the mask shown in FIG. 1B. As shown in FIG. 2, for example, a notch 5a is formed at the lower surface of each reinforcement portion 5 bridging the opening 4. The reinforcement portion 5 has a bridge-like shape obtained by inverting a rectangular concave shape. The reinforcement portions 5 may have an arch-like shape which is bent like a bow.

Here, owing to the above notch 5a, an incoming substance for deposition (hereinafter referred to as "deposition substance") can pass therethrough under the reinforcement portions 5 at the time of deposition, for example. Accordingly, the mask 1 can allow the deposition substance to easily pass through the openings 4. Moreover, even if the deposition substance adheres to the reinforcement portion 5 and over time, accumulates on the notch 5a, the deposition substance can still easily pass through the openings 4 compared to the mask having no notch 5a.

Note that if each reinforcement portion 5 has the notch 5a, the recess portion 6 of the mask 1 is preferably formed under the condition that the ratio between the width and height of the opening 4 (opening height/width) falls within, for example, 1.0±0.2. The opening height/width ratio of 1.0 is most desirable. By forming the recess portion 6 at this ratio, as shown in FIG. 2, a step is formed in the mask 1 and accordingly, the deposition substance can easily pass through the opening 4.

Figure 3:
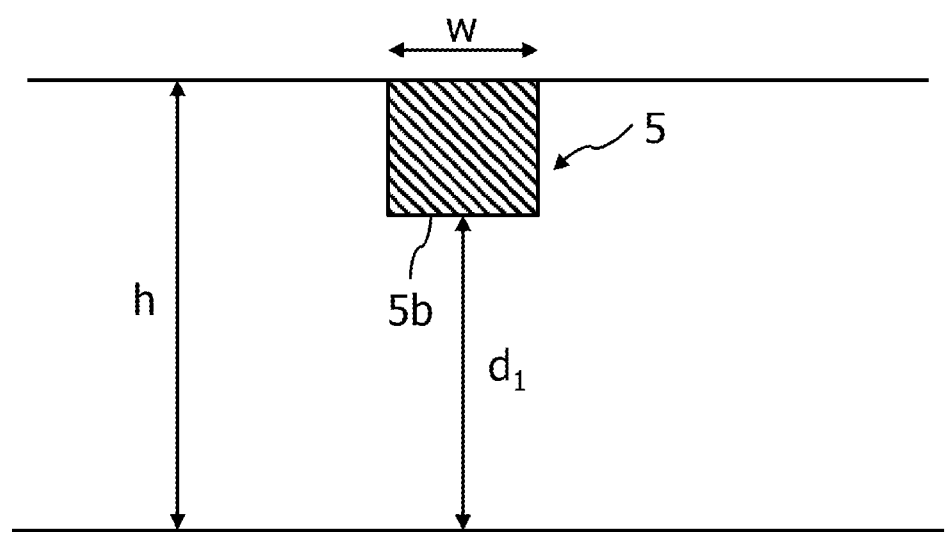
FIG. 3 is an enlarged sectional view of the mask taken along the line B-B of FIG. 1B.
Figure 4:
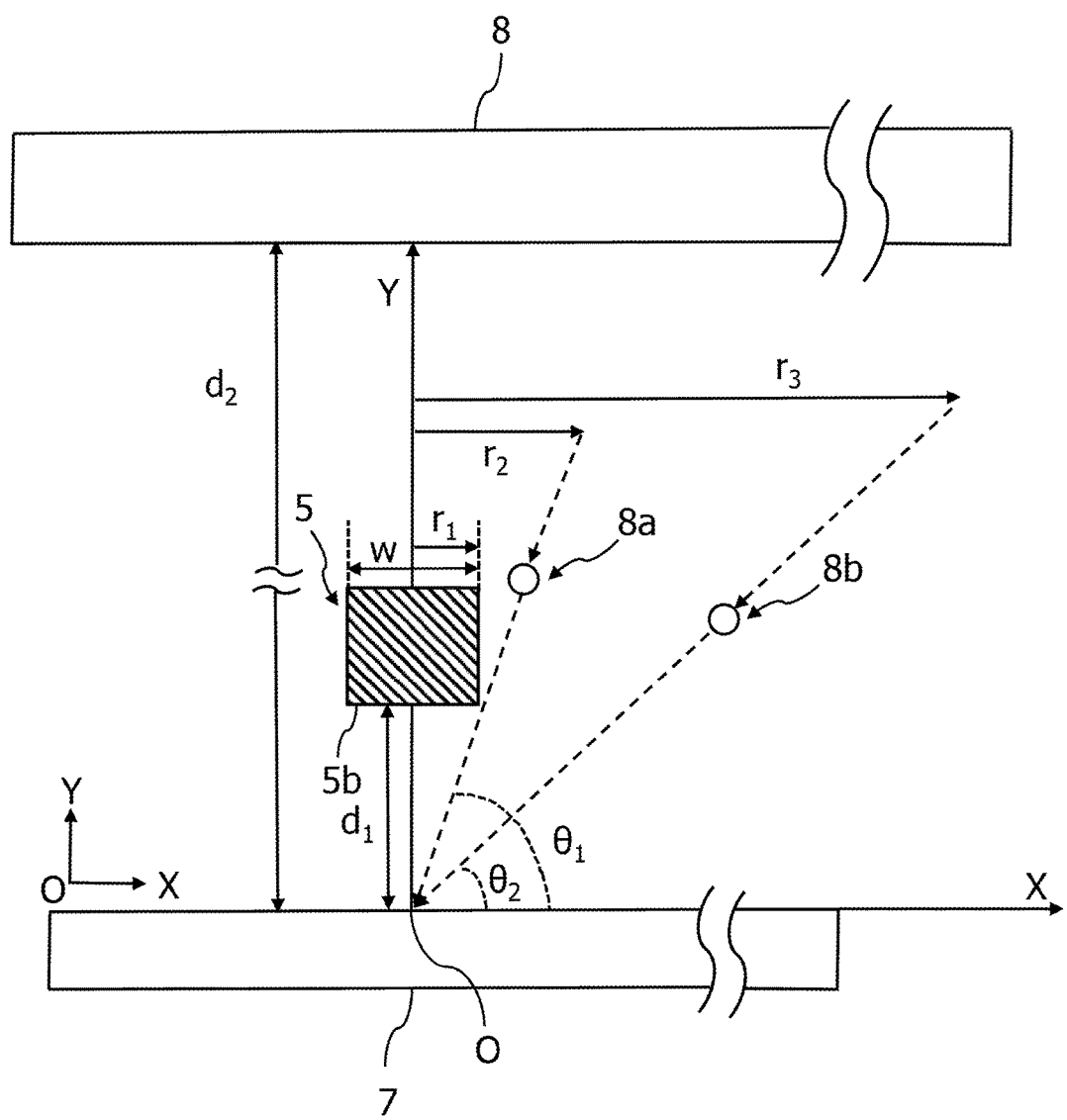
FIG. 4 schematically shows an example of the condition for numerical calculation executed to determine the width of a reinforcement portion.
Figure 5:
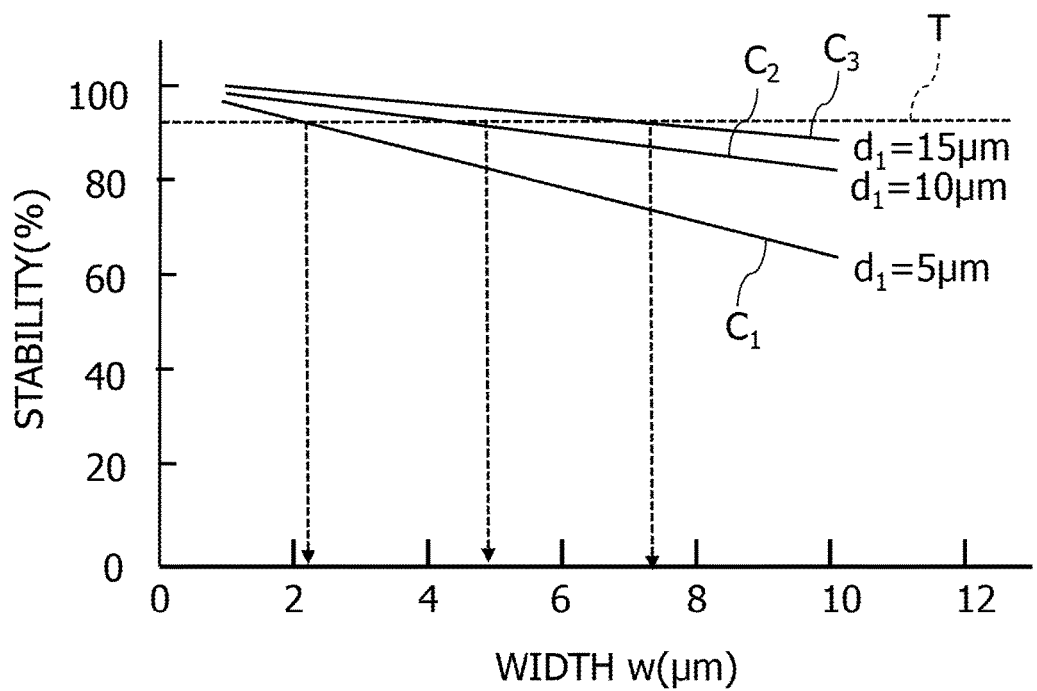
FIG. 5 is a graph showing an example of the results of numerical calculation executed to determine the width of a reinforcement portion.

FIG. 3 is an enlarged sectional view showing the mask taken along the line B-B of FIG. 1B. In FIG. 3, symbol w indicates the width of the reinforcement portion 5 in the direction crossing the width of the opening 4 in FIG. 2. Symbol $d_1$ indicates the distance from the upper surface of a transparent substrate 7 to a bottom portion 5b of the reinforcement portion 5 as described below with reference to FIG. 4. Symbol h indicates the height of the substrate 2. In FIG. 3, the bottom portion 5b corresponds to the deepest portion of the notch 5a of the reinforcement portion 5 shown in FIG. 2. Referring to FIGS. 4 and 5, described below is the relationship between width w and distance $d_1$ depending on the thickness of the mask 1.

FIG. 4 schematically shows an example of the condition for numerical calculation executed to determine the width of the reinforcement portion. For ease of explanation, FIG. 4 illustrates only the reinforcement portion 5 in FIG. 2 out of the mask 1. In reality, the deposition process is, for example, carried out while the transparent substrate 7 and the mask 1 are in contact with each other. The transparent substrate 7 is, for example, an ITO (indium tin oxide) film. In FIG. 4, symbol $d_2$ indicates the distance from a deposition source 8 to the transparent substrate 7 and the distance is, for example, 30 mm.

Moreover, in FIG. 4, symbol $r_1$ indicates a half of width w. Symbol $r_2$ indicates the reference distance that determines whether or not the deposition substance collides with the side of the reinforcement portion 5. To give a specific example, if a deposition substance 8a is emitted from the deposition source 8 toward the origin O (intersection between the X axis and the Y axis in FIG. 4) at predetermined emission angle within a range shorter than the distance indicated by symbol $r_2$ (the length of the arrow in FIG. 4), the deposition substance 8a collides with the side of the reinforcement portion 5 and fails to reach the origin O. Symbol $r_3$ indicates the distance (the length of the arrow in FIG. 4) up to the position (corresponding to the arrow head) which a deposition substance 8b passes after emitted from the deposition source 8 toward the origin O where the X axis and the Y axis intersect in FIG. 4) at a predetermined emission angle.

In addition, from another point of view, in FIG. 4, the deposition substance is emitted from the deposition source 8 toward the origin O at the angles of incidence indicated by symbols $\theta_1$ and $\theta_2$. The angle $\theta_1$ is the emission angle for the deposition substance upon spattering, for example, about 70 degrees. If the angle is greater than $\theta_1$, the deposition substance emitted toward the origin O collides with the reinforcement portion 5 and fails to reach the origin O. The angle $\theta_2$ is about 40 degrees. If the deposition substance is emitted from the deposition source 8 toward the origin O at an angle less than the angle $\theta_2$, the substance cannot easily reach the origin.

In other words, the width w is determined depending on parameters such as the distances $d_1$ and $d_2$, the emission angle (or the aforementioned angle of incidence) for the deposition substances 8a and 8b emitted from the deposition source 8, and the position of the reinforcement portion 5. Taking it into consideration, numerical calculation is executed based on these parameters so as to minimize the influence of the opening shaded by the reinforcement portion 5. The optimum shape of the reinforcement portion 5 can be determined through this calculation. If the value of the width w is optimized, for example, unevenness which occurs during deposition will be reduced.

FIG. 5 is a graph showing an example of the results of numerical calculation carried out to determine the width of the reinforcement portion. As understood from FIG. 5, the optimum width w can be determined according to different values of the distance $d_1$. In FIG. 5, the horizontal axis represents width w (μm) and the vertical axis represents the stability (%) depending on the width w (μm). The stability is 100% under the condition that no reinforcement portion 5 is provided because the deposition substance emitted toward the origin O is not blocked at all.

Furthermore, the stability of 90% means that the influence of the opening shaded by the reinforcement portion 5 is about 10%. This value falls within an allowable range for unevenness of a deposition layer at the time of deposition by spattering, for example. FIG. 5 shows the value (μm) of the width w relative to the distance $d_1$ at which the above high stability is achieved. As the reinforcement portion 5 bridges the opening 4, the opening just below the reinforcement portion 5 is shaded by the reinforcement portion 5. As a result, the incoming deposition substance from a specific direction collides with the reinforcement portion 5 and fails to reach the opening just below the reinforcement portion 5. The influence thereof should preferably be about 10% or less. Consider the case where the influence of about 10% (stability of about 90%) is set as the threshold value T and the distance $d_1$ is 5 μm, for example. In this case, the optimum width w is determined by finding the intersection between the horizontal axis and the normal from the intersection between the dashed line of FIG. 5 indicating the threshold value T (about 90%) and the solid line $C_1$ at the distance $d_1$=5 μm that is obtained by numerical calculation. As apparent from this, the width w is preferably about 2 μm.

Similarly, if the distance $d_1$ is 10 μm, the optimum width w is determined by finding the intersection between the horizontal axis and the normal from the intersection between the dashed line indicating the threshold value T and the solid line $C_2$ at the distance $d_1$=10 μm that is obtained by numerical calculation. In this case, the width w is preferably about 5 μm.

Likewise, if the distance $d_1$ is 15 μm, the optimum width w is determined by finding the intersection between the horizontal axis and the normal from the intersection between the dashed line indicating the threshold value T and the solid line $C_3$ at the distance $d_1$=15 μm that is obtained by numerical calculation. In this case, the width w is preferably about 7 μm. The height h of the polyimide film on the substrate 2 is preferably about 25 μm. Accordingly, the width w of the reinforcement portion 5 can be increased as the distance $d_1$ increases, without increasing the thickness of the mask 1.

As described above, in the mask according to the present invention, the reinforcement portion 5 and the recess portion 6 are formed based on, for example, data for processing shown in FIG. 5. Thus, the thick mask is unnecessary for forming the reinforcement portion 5, and the reinforcement portion 5 retains the strength of the mask 1. The mask according to the present invention can prevent the plural fine openings 4 from being deformed owing to the reinforcement portion 5. In addition, the shapes of the reinforcement portion 5 and the recess portion 6 allow the deposition substance to easily pass through the openings 4.

Note that although in FIG. 4, the deposition source 8 is illustrated as an example for discussion purpose, for example, a vapor-deposition source used for producing an organic EL (electroluminescence) device is usable instead. In this case, a substance for vapor deposition is emitted, and the width w can be determined in the above manner.

Described next is a modified example of the mask according to the embodiment of the present invention. In the above embodiment, as shown in FIG. 2, the mask 1 has the notch 5a formed in the reinforcement portion 5. The reason why the notch 5a is formed is, for example, that the deposition substance can easily reach the transparent substrate 7 under the reinforcement portion 5 as described above with reference to FIG. 4. However, the present invention is not limited to such mask.

Figure 6:
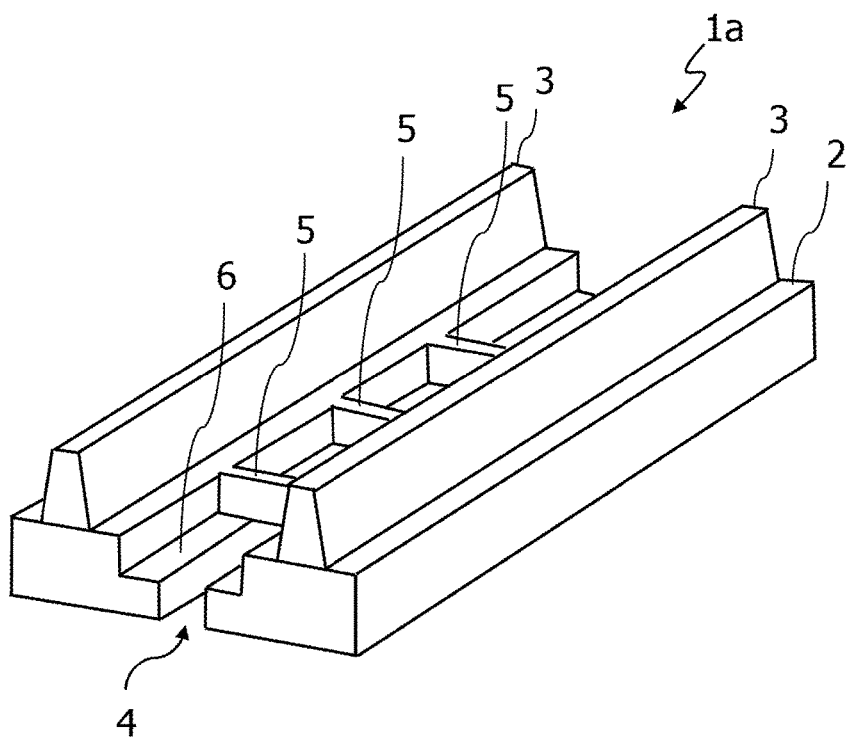
FIG. 6 is a perspective view of a modified example of the mask according to the embodiment of the present invention.

FIG. 6 is a perspective view of the modified example of the mask according to the embodiment of the present invention. Similar to the mask 1 of FIG. 1, in a mask 1a of the modified example, plural reinforcement portions 5 bridge the openings 4 across the longitudinal direction thereof on one side of the substrate 2. However, the notch 5a is not provided. In this example, as the notch 5a is omitted, the reinforcement portion 5 has the width w smaller than that of the reinforcement portion 5 in FIG. 2. It is preferable to reduce the width w so as to retain the same strength as the reinforcement portion 5 of FIG. 2 does. If the width w is reduced, the reinforcement portion 5 in FIG. 6 accordingly makes it easier for the deposition substance to reach the transparent substrate 7. Thus, the mask 1a of the modified example can achieve and retain high mechanical strength without increasing the thickness of the mask 1a.

Moreover, in the mask 1 according to the embodiment as shown in FIG. 1, the reinforcement portions 5 bridge the elongate openings 4, respectively, at the same position for all the openings in each row. The present invention is not limited to such mask. For example, the mask 1 may have such an alternating pattern that the reinforcement portions 5 are provided at different positions in adjacent openings 4.

More specifically, the mask 1 provided with the substrate 2 having the plural elongate openings 4 includes the plural reinforcement portions 5 having the thickness smaller than that of the substrate 2 and bridging the openings 4 across the longitudinal direction thereof on one side of the substrate 2, and the recess portion 6 formed by excavating areas around the openings on each side of the reinforcement portions 5 along the longitudinal direction of the openings to form steps. The mask may have such an alternating pattern that the reinforcement portions 5 are provided at different positions in adjacent openings 4.

Thus, since the mask 1 has the alternating pattern where the reinforcement portions 5 are provided at different positions in adjacent openings 4, the mask can similarly achieve and retain high mechanical strength without increasing the thickness of the mask for forming the reinforcement portion 5.

Note that the interval between the reinforcement portions 5 is preferably set not to cause any interference between adjacent reinforcement portions 5 in the openings 4. Owing to the settings, the influence of an area shaded by the adjacent reinforcement portion 5 can be ignored.

Referring to FIGS. 7 to 9C, a method for manufacturing a mask according to the present invention is described next. According to the method for manufacturing a mask, it is possible to provide a mask that achieves and retains high mechanical strength without increasing its thickness. Referring to FIG. 8, described first is a mask processing device necessary for the method for manufacturing a mask according to the present invention.

FIG. 8 is a block diagram showing a configuration example of the mask processing device. A mask processing device M is used to manufacture the mask according to the present invention and provided with a control unit 10, a laser generating unit 11, an optical system 12, a transfer unit 13, and a bus 14. Among these, the laser generating unit 11, the optical system 12, the transfer unit 13, and the control unit 10 are connected with one another by means of the bus 14.

The control unit 10 executes control over the mask processing device M and incorporates a microprocessor. The control unit issues an instruction to, for example, the laser generating unit 11 to generate laser light. In addition, the control unit 10 issues an instruction to, for example, the transfer unit 13 to control positioning etc. for the mask 1.

The control unit 10 further includes a memory 10a. The memory 10a records programs, data, or the like. The memory is, for example, a nonvolatile memory that previously records control programs for controlling the mask processing device M. The control programs include a program for executing the method for manufacturing a mask according to the present invention. The memory 10a also records previously data for processing that is necessary for processing the mask. Note that the data for processing may be previously embedded in the control program. Positional information about the reinforcement portion 5 and the recess portion 6 is previously integrated into the data for processing.

The control unit 10 reads, for example, the control program from the memory 10a and references the data for processing to thereby manufacture the mask 1. The control unit 10 executes, for example, arithmetic processing to record the result on the memory 10a.

The laser generating unit 11 generates laser light. In response to the instruction to generate laser light from the control unit 10, the laser generating unit 11 emits laser light to the optical system 12. The laser generating unit 11 is provided with a YAG (yttrium aluminum garnet) laser device as a kind of laser. The YAG laser device performs, for example, laser processing and serves to excite and oscillate laser light using a YAG rod as an oscillator. The laser generating unit 11 may adopt other laser generating means, for example, laser devices such as an excimer laser device, for example, instead of the YAG laser device.

The optical system 12 converts the laser light into the one having the wavelength suitable for laser processing and condenses the converted light. The optical system includes a wavelength converting crystal for converting the wavelength of laser light oscillated from the YAG laser device. After passing through the wavelength converting crystal, the laser light is converted to higher harmonics as a solid UV (ultraviolet) laser. The optical system 12 includes optical components for reduced projection with a predetermined rate in order to condense the laser light converted into higher harmonics onto the mask 1.

The transfer unit 13 adjusts the position of the mask 1 placed on a stage (not shown) and, for example, can move the mask 1 to the left or right using a positioning mechanism (not shown). Further, the transfer unit 13 can invert the mask 1 using an inverting mechanism (not shown).

Referring next to FIGS. 7 and 9A to 9C, a description is given of the method for manufacturing a mask with the aforementioned mask processing device M.

Figure 9A:
FIGS. 9A to 9C schematically show each step in the method for manufacturing a mask.
Figure 9B:
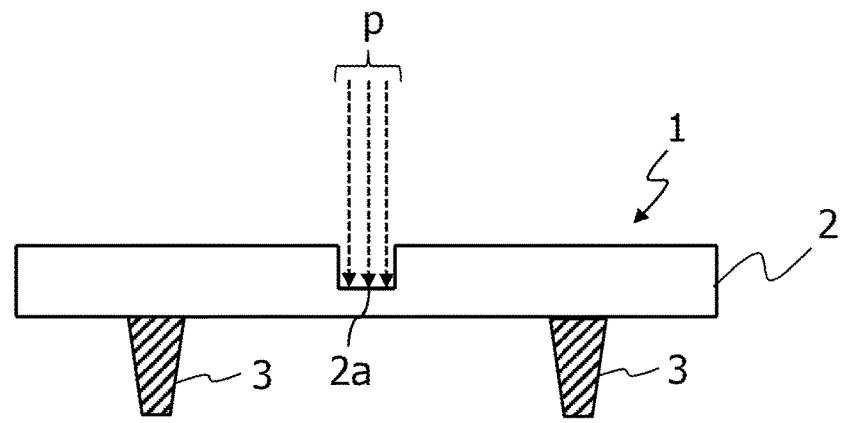
Figure 9C:
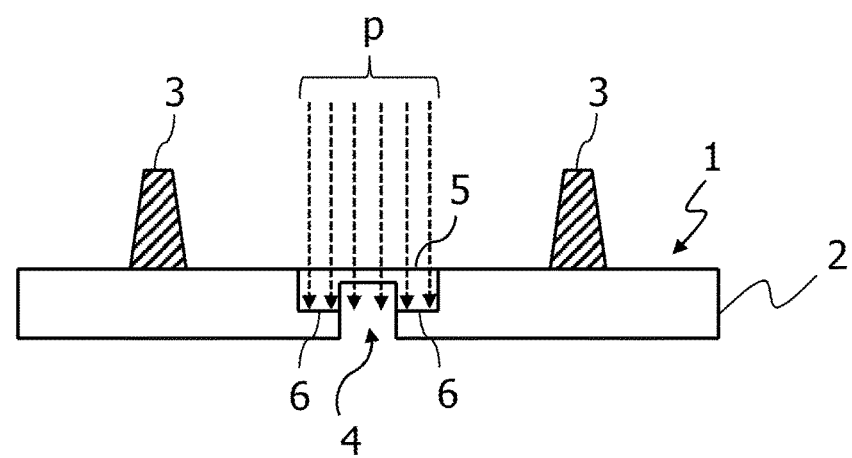

FIG. 7 is a flowchart showing an example of the method for manufacturing a mask according to the present invention. FIGS. 9A to 9C schematically show each step in the method for manufacturing a mask according to an embodiment of the present invention. FIG. 9A is a partially enlarged sectional view of the mask 1 in a step of supplying a substrate member. FIG. 9B schematically shows a patterning step (first step). FIG. 9C schematically shows an excavating step (second step).

First of all, the control unit 10 of the mask processing device M shown in FIG. 8 receives an instruction to start manufacturing a mask according to the present invention from an input means (not shown), for example, and then reads the control program or data for processing to start the processing according to the flowchart in FIG. 7.

In step S1 of FIG. 7, the control unit 10 issues an instruction to the transfer unit 13 shown in FIG. 8 to thereby supply a substrate member. In the method for manufacturing a mask according to the present invention, the metal portions 3 are previously aligned at predetermined intervals on the surface (second surface) of the substrate 2. As shown in FIG. 9A, the metal portions 3 having a trapezoid shape in section are placed in advance at predetermined intervals on the surface of the substrate 2, on both sides of an area for forming the opening. The transfer unit 13 moves the mask 1 on a stage (not shown), which has not undergone patterning up to a laser irradiation position. After the mask 1 is moved, the control unit 10 proceeds to the processing in step S2.

In step S2 of FIG. 7, the control unit 10 issues an instruction to the laser generating unit 11 shown in FIG. 8 to thereby perform patterning for forming a groove 2a to be the opening, on the back side (first surface) of the mask 1 (first step). More specifically, the laser generating unit 11 excites and oscillates laser light p from the YAG laser device. The laser light p is converted into higher harmonics by the optical system 12 shown in FIG. 8 and then irradiated to a position where the groove 2a is to be formed as shown in FIG. 9B. This irradiation process excavates polyimide of the mask 1 to form the groove 2a. In FIG. 9B, the laser light p is illustrated in the form of light flux as indicated by the dashed arrows. In this case, the transfer unit 13 appropriately moves the mask 1 on the stage along the vertical direction as viewed in the drawings of FIGS. 9A to 9C so that the laser can be irradiated to a position where the convex groove 2a is to be formed. Accordingly, the groove 2a can be formed over the back side of the mask 1, at all positions where the opening is to be formed.

Note that the control unit 10 can adjust the depth of the notch 5a of the reinforcement portion 5 as shown in FIG. 2 by controlling the degree at which the laser light p excavates the polyimide. After the completion of patterning, the control unit 10 proceeds to the processing in step S3.

In step S3 of FIG. 7, the control unit 10 issues an instruction to the laser generating unit 11 shown in FIG. 8 to form the opening 4 in conjunction with excavating for forming the reinforcement portion 5 and the recess portion 6 (second step). More specifically, in response to an instruction issued from the control unit 10 to the transfer unit 13, the transfer unit 13 moves the mask 1, for example, together with the stage away from the laser irradiation position and then inverts the mask 1 upside down and places it again on the stage. Following this, the transfer unit 13 moves the inverted mask 1 on the stage back to the laser irradiation position.

Next, in response to an instruction from the control unit 10, the laser generating unit 11 excites and oscillates the laser light p from the YAG laser device. At this time, the laser generating unit 11 irradiates to the mask 1 via the optical system 12, the laser light p having a larger beam diameter than the one in the patterning in step S1.

In other words, as shown in FIG. 9C, the control unit 10 instructs the laser generating unit 11 to execute laser processing with the laser light p, by which the mask 1 undergoes laser irradiation from the front side (second surface) of the substrate 2 opposite to the back side (first surface) thereof to penetrate the groove 2a to thereby form the opening 4. At this time, the plural reinforcements units 5 are formed bridging the openings 4 across the longitudinal direction thereof, and also a step is formed by excavating an area around each opening on each side of the reinforcement portion 5 along the longitudinal direction of the opening to thereby form the recess portion 6.

To be specific, the control unit 10 issues an instruction to the laser generating unit 11 to irradiate the laser light p from the front side (second surface) to thereby excavate the polyimide and penetrate the groove 2a formed in step S2. As a result, the opening 4 is formed in the mask 1. In this case, the control unit 10 issues an instruction to the laser generating unit 11 to excavate an area around the opening along the longitudinal direction in the manner of destroying the molecular structure of the polyimide using the laser light to thereby form the recess portion 6 at several positions of the mask 1 (see FIG. 2). Accordingly, the reinforcement portions 5 are formed at predetermined intervals across the openings 4 in a one-to-one correspondence in each area not subjected to laser irradiation (see FIG. 2). At this time, the control unit 10 executes, for example, control such that the reinforcement portions 5 are at the same position for all the openings in each row. As described above, the reinforcement portions 5 have the thickness smaller than the substrate 2 and bridge the openings 4 across the longitudinal direction thereof. Note that although the opening 4 passes through the mask, the reinforcement portion 5 retains the mask strength.

As the control unit 10 gives an instruction to move the mask 1 and apply laser irradiation to the mask this way, the mask 1 shown in FIG. 1 can be manufactured. To be specific, in the method for manufacturing a mask according to the present invention, both sides of the mask 1 are processed to thereby execute pattern formation for the opening 4, the formation of the reinforcement portion 5, and the formation of the recess portion 6 within a single manufacturing step. After the completion of manufacturing the mask 1, the control unit 10 instructs the transfer unit 13 to transfer the mask 1 together with the stage toward a predetermined position. Then, the control unit 10 completes the processing shown in the flowchart of FIG. 7. In the case of processing both sides of the mask, high positioning accuracy is required on both the front and back sides of the mask. However, in the method for manufacturing a mask according to the present invention, if patterning is executed on the back side for forming the opening 4 with high positioning accuracy, such high positioning accuracy is unnecessary for the front side. This is because the recess portion 6 has the width somewhat larger than necessary for the excavating process as shown in FIG. 9C, and the opening width is determined through patterning. Therefore, in the method for manufacturing a mask according to the present invention, the pattern formation for the opening 4 can be executed with high accuracy.

As described above, the method for manufacturing a mask according to the present invention makes it possible to achieve and retain high mechanical strength of the mask owing to the reinforcement portion 5 and the recess portion 6 without increasing the mask thickness. Thus, the method for manufacturing a mask according to the present invention can produce a mask having finer, elongate openings without deforming the finer openings at the manufacturing stage, for example.

It should be noted that the entire contents of Japanese Patent Application No. 2013-258324, filed on Dec. 13, 2013, on which convention priority is claimed, is incorporated herein by reference.

It should also be understood that many modifications and variations of the described embodiments of the invention will be apparent to a person having an ordinary skill in the art without departing from the spirit and scope of the present invention as claimed in the appended claims.

What is claimed is:

1. A mask having a plurality of elongate openings formed in a substrate, comprising:
   a plurality of reinforcement portions with a thickness smaller than a thickness of the substrate, which bridge the openings across a longitudinal direction thereof on one side of the substrate and have a notch at a lower surface of the respective reinforcement portions bridging the openings; and
   a recess portion having a step in an area around the openings on each side of the reinforcement portions along the longitudinal direction,
   wherein a width of the respective reinforcement portions is determined depending on a plurality of parameters including at least a distance from an upper surface of a transparent substrate to be subjected to a deposition process to a bottom portion of the respective reinforcement portions, a distance from a deposition source for emitting a deposition substance to the transparent substrate, and an emission angle of the deposition substance emitted from the deposition source, and
   wherein the notch is provided in each of the reinforcement portions so as to allow the deposition substance emitted from the deposition source to pass through an opening just below the reinforcement portion.

2. The mask according to claim 1, wherein the substrate is a resin film, and a plurality of magnetic metal portions are further provided on the substrate, alternating with the openings at a predetermined interval on the one side of the substrate where the plurality of reinforcement portions are provided.

* * * * *